United States Patent
Hsu et al.

(10) Patent No.: US 8,338,242 B2
(45) Date of Patent: Dec. 25, 2012

(54) BACKSIDE BEVEL PROTECTION

(75) Inventors: Jung-Tzu Hsu, Taoyuan (TW);
Ching-Chung Pai, Taipei (TW);
Yu-Hsien Lin, Hsinchu (TW); Jyh-Huei Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 15 days.

(21) Appl. No.: 13/077,257

(22) Filed: Mar. 31, 2011

(65) Prior Publication Data
US 2012/0248510 A1    Oct. 4, 2012

(51) Int. Cl.
*H01L 21/338* (2006.01)

(52) U.S. Cl. ........ 438/183; 438/300; 438/583; 438/655; 257/369; 257/407; 257/E27.06; 257/E27.062

(58) Field of Classification Search .................. None
See application file for complete search history.

(56) References Cited

U.S. PATENT DOCUMENTS

| | | | |
|---|---|---|---|
| 6,506,673 B2 * | 1/2003 | Ma et al. ................. | 438/622 |
| 7,682,914 B2 * | 3/2010 | Lo et al. ................. | 438/300 |
| 7,781,288 B2 * | 8/2010 | Haensch et al. ......... | 438/275 |
| 7,812,414 B2 * | 10/2010 | Hou et al. ................ | 257/412 |
| 8,008,145 B2 * | 8/2011 | Liao et al. ............... | 438/199 |
| 8,035,165 B2 * | 10/2011 | Yeh et al. ................ | 257/369 |
| 8,053,323 B1 * | 11/2011 | Lin et al. ................. | 438/303 |

* cited by examiner

*Primary Examiner* — Zandra Smith
*Assistant Examiner* — Khanh Duong
(74) *Attorney, Agent, or Firm* — Lowe Hauptman Ham & Berner, LLP

(57) ABSTRACT

The disclosure provides methods and structures for preventing exposing polysilicon layer and silicon substrate on the substrate backside to polysilicon etching chemistry during removal of the dummy polysilicon layer in replacement gate structures. A thermal deposition process or processes are used to deposit a dielectric layer for offset spacers and/or a contact etch stop layer (CESL) to cover the polysilicon layer on the substrate backside. Such mechanisms reduce or eliminate particles originated at bevel of substrate backside, due to complete removal of the polysilicon layer at the backside bevel and the resultant etching of silicon substrate.

20 Claims, 5 Drawing Sheets

BACKSIDE BEVEL PROTECTION

FIELD

The present disclosure relates generally to an integrated circuit (IC) device and, more particularly, to mechanisms of protecting a substrate backside bevel.

BACKGROUND

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed a "gate last" process in which the final gate stack is fabricated "last" which allows for a reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high dielectric constant (high-k) gate insulator layers are also used which allow greater physical thicknesses while maintaining the same effective thickness as would be provided by a typical gate oxide used in larger technology nodes.

In addition to the introduction of gate last processing, other features and processes are introduced in complementary metal-oxide-silicon (CMOS) fabrication to improve the device performance. The integration of the CMOS fabrication process flow for advanced technology nodes to produce devices with good performance and high yield has many challenges.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
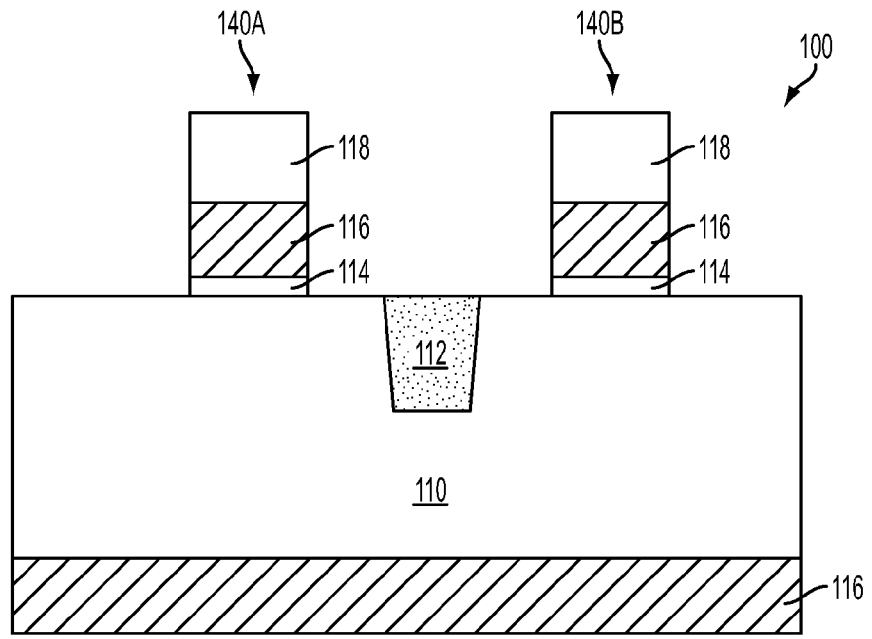
FIGS. 1-6 show cross-sectional views of processing a semiconductor device, in accordance with some embodiments.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1-6, cross-sectional views of processing a semiconductor device 100 are described below, in accordance with some embodiments. The semiconductor device 100 illustrates an integrated circuit, or portion thereof, that can comprise memory cells and/or logic circuits. The semiconductor device 100 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional processing operations can be provided before, during, and/or after the sequence described below. Further, some of the operations described below can be replaced or eliminated, for additional embodiments of the processing sequence (or method). It is further understood that additional features can be added in the semiconductor device 100, and some of the features described below can be replaced or eliminated, for additional embodiments of the semiconductor device 100.

FIG. 1 shows a substrate 110. In the present embodiment, the substrate 110 is a semiconductor substrate comprising silicon. Alternatively, the substrate 110 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 110 may include various doped regions depending on design requirements (e.g., p-type wells or n-type wells). The doped regions may be doped with p-type dopants, such as boron or $BF_2$, and/or n-type dopants, such as phosphorus or arsenic. The doped regions may be formed directly on the substrate 110, in a P-well structure, in an N-well structure, in a dual-well structure, or using a raised structure. The semiconductor substrate 110 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 100 may be formed by CMOS technology processing, and thus some processes are not described in detail herein.

An exemplary isolation region 112 is formed in the substrate 110 to isolate various regions of the substrate 110, and in the present embodiment, to isolate the NMOS and PMOS device regions. The isolation region 112 utilizes isolation technology, such as local oxidation of silicon (LOCOS) or shallow trench isolation (STI), to define and electrically isolate the various regions. In the present embodiment, the isolation region 112 includes an STI. The isolation region 112 comprises silicon oxide, silicon nitride, silicon oxynitride, other suitable materials, or combinations thereof. The isolation region 112 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride or silicon oxide.

A material layer is formed over the substrate 110. The material layer includes one or more material layers comprising any suitable material and thickness. The material layer can include interfacial layers, capping layers, diffusion/barrier layers, dielectric layers, high-k dielectric layers, conductive layers, gate layers, liner layers, seed layers, adhesion layers, other suitable layers, and/or combinations thereof. The material layer is formed by any suitable process including chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The semiconductor device 100 may include one or more antireflective coating layers, such as a top antireflective coating layer and/or a bottom antireflective coating layer.

In one embodiment, the material layer includes a gate dielectric layer 114 and a gate electrode layer 116. The gate dielectric layer 114 is formed over the substrate 110 by any suitable process to any suitable thickness. The gate dielectric layer 114, for example, is made of silicon oxide, silicon oxynitride, silicon nitride, spin-on glass (SOG), fluorinated silica glass (FSG), carbon doped silicon oxide, BLACK DIAMOND® (Applied Materials of Santa Clara, Calif.), Xerogel, Aerogel, amorphous fluorinated carbon, Parlyene, BCB (bis-benzocyclobutenes), SILK™ (Dow Chemical, Midland, Mich.), polyimide, other suitable dielectric materials, or combinations thereof. The gate dielectric layer 114 may comprise a high-k dielectric material, such as $HfO_2$, HfSiO, HfSiON, HfTaO, HfSiO, HfZrO, other suitable high-k dielectric materials, and/or combinations thereof. The gate dielectric layer 114 can further include an interfacial layer, which comprises a grown silicon oxide layer (e.g., thermal oxide or chemical oxide) or silicon oxynitride (SiON). The gate dielectric layer 114 has a thickness in a range from about 10 angstroms (Å) to about 100 Å, in accordance with some embodiments. In some other embodiments, the gate dielectric layer 114 has a thickness in a range from about 10 angstroms (Å) to about 50 Å.

The gate electrode layer 116 is formed over the gate dielectric layer 114 by any suitable process to any suitable thickness. In the present embodiment, the gate electrode layer 116 is a polysilicon layer. The polysilicon (or poly) layer is formed by thermal CVD or other suitable deposition process. For example, silane ($SiH_4$) may be used as a chemical gas in the CVD process to form the gate electrode layer 116. The gate electrode layer 116 has a thickness in a range from about 400 angstroms (Å) to about 1000 Å, in accordance with some embodiments. In some other embodiments, the gate electrode layer 116 has a thickness in a range from about 600 angstroms (Å) to about 900 Å. In some embodiments, the gate electrode layer 116 is formed by a thermal CVD process and the gate electrode layer 116 is also formed on the backside of substrate 110 as shown in FIG. 1. In another embodiment, gate electrode layer 116 and/or the gate dielectric layer 114 may be sacrificial (or dummy) layers and will be removed by a replacement step after a gate patterning process.

FIG. 1 also shows that a hard mask layer 118 is formed over the gate electrode layer 116. In some embodiments, a treatment is performed on the gate electrode layer 116 to transform at least one portion of the gate electrode layer 116 to an electrically neutralized layer (not shown). The electrically neutralized layer is used to neutralize positive charge within the polysilicon gate electrode induced by boron implantation through the hard mask. Details of the described electrically neutralized layer are described in U.S. patent application Ser. No. 12/758,491, entitled "A Method of Fabricating Gate Electrode Using a Treated Hard Mask," and filed on Apr. 12, 2010, which is incorporated herein in its entirety.

The hard mask layer 118, in one embodiment, includes silicon oxide. The hard mask layer 118, in another embodiment, may include silicon oxide ($SiO_2$), silicon nitride (SiN), silicon oxynitride (SiON), silicon carbide (SiC), SiOC, spin-on glass (SOG), a low-k film, and an amorphous carbon material, etc. If the film is a silicon oxide, it can be a tetra-ethylorthosilicate (TEOS) oxide, a plasma enhanced CVD oxide (PE-oxide), or a high-aspect-ratio-process (HARP) formed oxide. The hard mask layer 118 may also be formed of a combination of the above-mentioned materials. The hard mask layer 118 may be formed using methods such as CVD, PVD, or ALD and may have a thickness ranging from about 600 angstroms (Å) to about 1000 Å.

FIG. 1 further illustrates that gate structures, such as 140A and 140B, comprising a gate dielectric 114, a gate electrode layer 116, and a hard mask 118 are formed by any suitable process. For example, a layer of photoresist (not shown) is formed over the hard mask layer 118 by a suitable process, such as spin-on coating, and patterned to form a patterned photoresist feature. The pattern of the photoresist can then be transferred by a dry etching process to the underlying gate dielectric layer 114, the gate electrode layer 116, and the hard mask layer 118 to form the gate structures, 140A and 140B. Additionally, an anti-reflective coating (ARC) layer (not shown) may be formed on the hard mask layer 118 and under the layer of photoresist to enhance a subsequent patterning process. The photolithography patterning processes may include soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. Then, an etching process, including dry etching, wet etching, and/or other etching methods (e.g., reactive ion etching) is provided to from a gate structure for the PMOS device 140A and a gate structure for the NMOS device 140B. The photoresist layer may be stripped thereafter. It is understood that the above examples do not limit the processing steps that may be utilized to form the gate structures.

Figure 2:
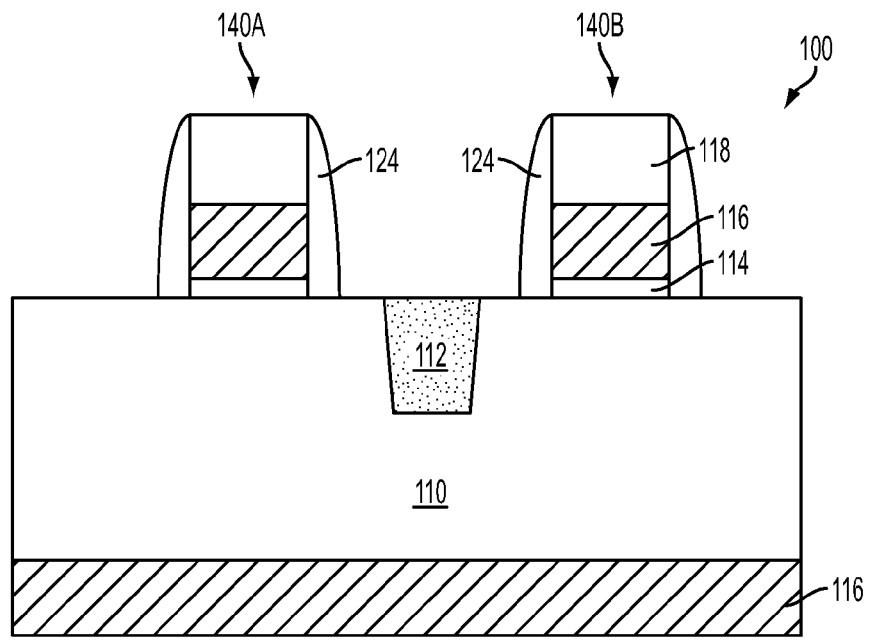

After the gate structures, 140A and 140B, are formed, offset spacers 124 are formed overlying sidewalls of the PMOS/NMOS devices 140A/140B, in accordance with some embodiments as shown in FIG. 2. In an example, the offset spacers 124 are formed by blanket depositing a dielectric layer over the gate structures of PMOS/NMOS devices 140A/140B and the substrate 110, and then the dielectric layer is etched to form offset spacers 124. The dielectric layer comprises, for example, silicon nitride, silicon oxide, silicon carbide, silicon oxynitride, nitride silicon carbide (SiCN), other suitable materials, and/or combinations thereof. The thickness of the dielectric layer is in a range from 50 Å to about 400 Å. The dielectric layer may be formed by using techniques such as plasma enhanced chemical vapor deposition (PECVD), low-pressure chemical vapor deposition (LPCVD), sub-atmospheric chemical vapor deposition (SACVD), atomic layer deposition (ALD), or plasma-enhanced ALD (PEALD), and the like. The etching may be performed by a wet etching process, a dry etching process, or combinations thereof. Preferably, the dielectric layer is etched by a dry etching process. More preferably, the dielectric layer is etched by an anisotropic dry etching process.

Figure 3:
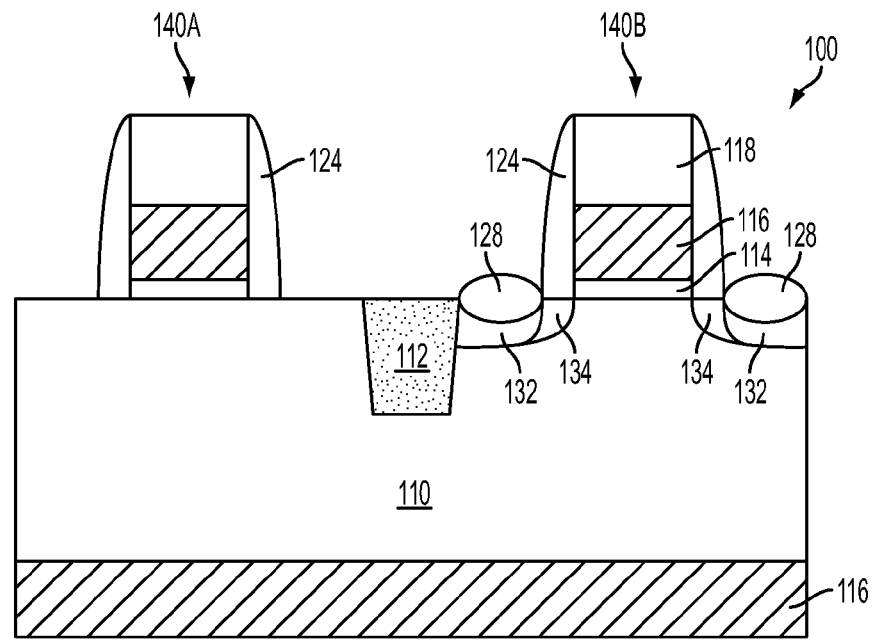

After the formation of the offset spacers 124, recesses may be optionally formed on each side of the gate structure of NMOS device 140B in the substrate 110. During this processing step, recesses are prevented from being formed around the PMOS device 140A by covering device 140A with a protector (not shown), e.g., a photoresist pattern, while the NMOS device 140B is exposed. Other material layer(s) could also be between the protector layer and the PMOS device 140A. The recesses may be formed by any suitable process and are substantially aligned with edges of the offset spacers 124 of the gate structure of NMOS device 140B. The recesses 126 may be formed by a selective etching process, which can include one or more wet etching and/or dry etching processes. Then, the protector may be removed by a stripping process. Thereafter, N-type strained source/drain (NSSD) regions 128 are formed by any suitable process over the recesses 126 as illustrated in FIG. 3, in accordance with some embodiments. In one embodiment, the NSSD regions 128 are formed by one or more epitaxial growth processes to any suitable thickness. An exemplary NSSD regions 128 thickness is in a range from about 200 Å to about 500 Å. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 110. The NSSD regions 128 comprise any suitable material, such as epitaxially doped silicon, SiC, SiP, and/or combinations thereof. A cleaning process may be subsequently performed, such as a cleaning process utilizing a diluted HF (or DHF) cleaning solution.

Various implantation processes are performed on the substrate 110, as shown in FIG. 3 in accordance with some embodiments. The various implantation processes may form various doped regions. The doped regions may comprise various doping profiles and may be formed by a plurality of implantation processes. In one embodiment, N-type lightly doped source/drain (NLDD) regions 132 may be formed in or under the NSSD regions 128 by one or more ion implantation processes. The NLDD regions 132 are substantially aligned with edges of the offset spacers 124 of the gate structure of NMOS device 140B. In another embodiment, P-type pocket regions 134 may be formed adjacent to the NSSD regions 128 and under the offset spacers 124 by one or more ion implantation processes. The P-type pocket regions 134 are formed before the formation of the offset spacers 124 to be aligned with the edges of the gate dielectric layer 114, in accordance with some embodiments. The implantation for forming the NLDD regions 132 and P-type pocket regions 134 may employ tilt angle processes by any suitable angles.

After the formation of the doped regions, such as NSSD regions 128 and NLLD regions 132, recesses are formed on each side of the gate structure of PMOS device 140A in the substrate 110. A protector (not shown), e.g., photoresist pattern, may be formed overlying the NMOS device 140B while the PMOS device 140A is exposed. Other material layer(s) could also be between the protector layer and the NMOS device 140B. The recesses are formed on each side of the gate structure of PMOS device 140A by any suitable process, and are substantially aligned with edges of the offset spacers 124 of the gate structure of PMOS device 140A. The recesses may be formed by a selective etching process, which can include one or more wet etching and/or dry etching processes. Then, the protector is removed by a stripping process.

Figure 4:
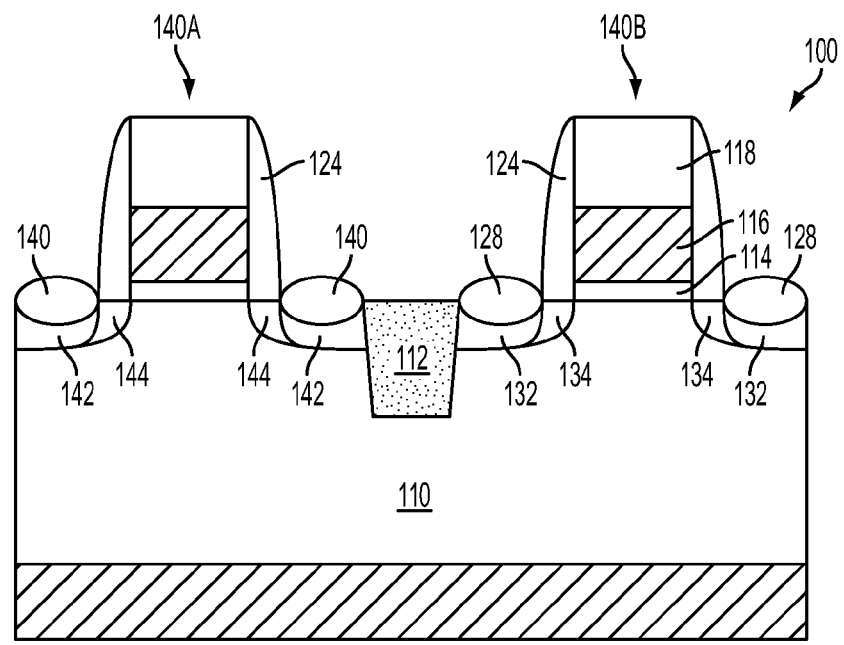

FIG. 4 shows P-type strained source/drain drain (PSSD) regions 140 are formed by any suitable process over the recesses. In one embodiment, the PSSD regions 140 are formed by one or more epitaxial growth processes to any suitable thickness. The exemplary PSSD regions 140 thickness is in a range from about 300 Å to about 800 Å. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 110. The PSSD regions 140 comprise any suitable material, such as epitaxially grown SiGe. A cleaning process may be subsequently performed, such as cleaning process utilizing a DHF cleaning solution.

Subsequently, various implantation processes are performed on the substrate 110. The various implantation processes may form various doped regions. The doped regions may comprise various doping profiles and may be formed by a plurality of implantation processes. In one embodiment, P-type lightly doped source/drain (PLDD) regions 142 may be formed in PSSD regions 140 by one or more ion implant processes. The PLDD regions 142 are substantially aligned with the edges of the offset spacers 124 of the gate structure of PMOS device 140A. In another embodiment, N-type pocket regions 144 may be formed adjacent to the PSSD regions 140 and under the offset spacers 124 by one or more ion implant processes. The P-type pocket regions 134 could have been formed before the formation of the offset spacers 124. The implantation for forming the PLDD regions 142 and N-type pocket regions 144 may employ tilt angle processes by any suitable angles.

Source/drain (S/D) regions (not shown) may be formed in the substrate 110 for the NMOS/PMOS devices 140B, 140A by a conventional implantation process. One or more contact features (not shown), such as silicide regions, may also be formed by any suitable process on the S/D regions.

Subsequent processing may implement a gate replacement process. For example, metal gates may replace the gate electrode layer 116 of the gate structures of the NMOS/PMOS devices 140B, 140A. A first metal gate having a first work function may be formed in the gate structure of the NMOS devices 140B and a second gate structure having a second work function may be formed in the gate structure of the PMOS devices 140A. The metal gates may comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Figure 5:
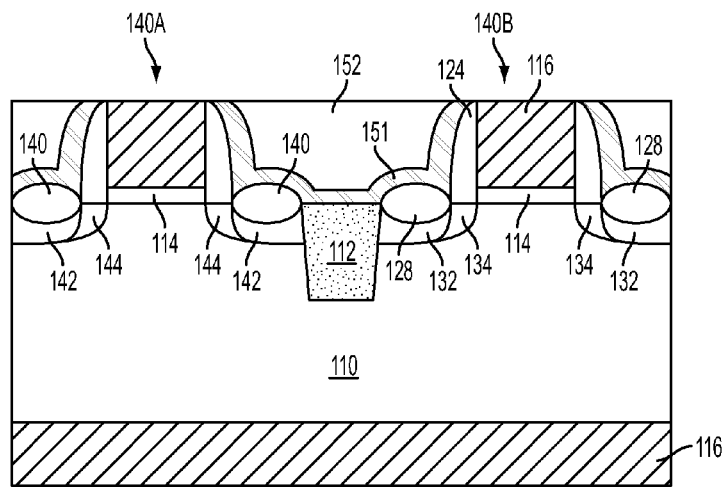

In order to replace the gate electrode layer 116 with other gate materials, the gate electrode layer 116 needs to be removed from gate structures 140A and 140B first. FIG. 5 shows a cross-sectional view of the semiconductor device 100 when the gate electrode layer 116 is ready to be removed, in accordance with some embodiments. FIG. 5 shows that the hard mask layer 118 has been removed. A contact etch stop layer (CESL) 151 and an inter-metal dielectric layer before first metal layer (ILD0) 152 have been deposited and planarized to expose the gate electrode layer 116. CESL 151 is made of a dielectric material, such as silicon nitride or silicon oxynitride, other suitable materials, which has high etch selectivity in comparison with ILD0 152 and the gate dielectric layer 114 to allow proper contact etching. The thickness of CESL 151 ranges from about 100 Å to about 800 Å. CESL 151 may be formed by using techniques such as plasma enhanced chemical vapor deposition (PECVD), low-pressure chemical vapor deposition (LPCVD), sub-atmospheric chemical vapor deposition (SACVD), atomic layer deposition (ALD), or plasma-enhanced ALD (PEALD), and the like.

ILD0 152 is made a dielectric material, such as an oxide, a doped oxide, a low-dielectric-constant (low-k) dielectric, or other suitable materials, and/or combinations thereof. The thickness of the dielectric layer is ranging from 1000 Å to about 5000 Å. The ILD0 152, for example, is made of silicon oxide, silicon oxynitride, silicon nitride, spin-on glass (SOG), fluorinated silica glass (FSG), carbon doped silicon oxide, BLACK DIAMOND®, Xerogel, Aerogel, amorphous fluorinated carbon, Parlyene, BCB (bis-benzocyclobutenes), SILK™ (Dow Chemical, Midland, Mich.), polyimide, other suitable dielectric materials, or combinations thereof. ILD0 152 may also be doped with a dopant, such as phosphorous (P), which can help getter ions. ILD0 152 may be formed by using techniques such as spin-on, plasma enhanced chemical vapor deposition (PECVD), low-pressure chemical vapor deposition (LPCVD), sub-atmospheric chemical vapor deposition (SACVD), high-density plasma CVD (HPCVD), and the like.

After the CESL 151 and ILD0 152 are deposited, a planarization process is used to remove ILD0 152 and CESL 151 above the gate electrode layer 116 to expose the gate electrode layer 116. Afterwards, the gate electrode layer 116 is removed by etching to allow different material layers to be deposited in the opening created (or formed) by removing the dummy gate electrode layer. The different material layers may include, but are not limited to, oxide dielectric layers, high dielectric constant (high-k) dielectric layers, barrier layers, work function layers, gate electrode (or gate metal) layers, etc. Exemplary details about the various material layers in a replacement gate structure is described in U.S. patent application Ser. No. 12/702,525, titled "Integration of Bottom-Up Metal Film Deposition" and filed on Feb. 9, 2010, which is incorporated by reference herein in its entirety.

Figure 6:
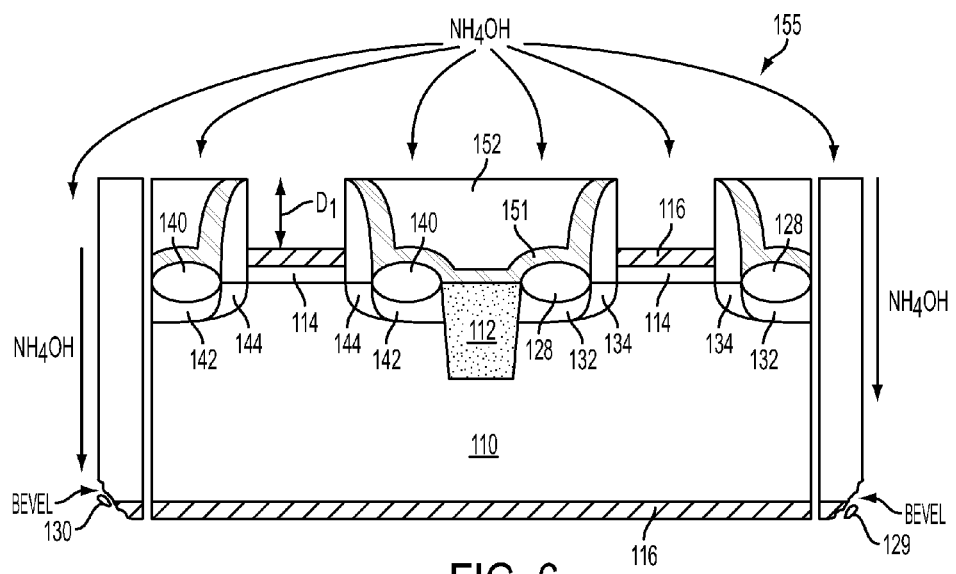

In the present embodiment, the gate electrode layer 116 is made of polysilicon. A wet etch 155, using a diluted $NH_4OH$, can be used to etch the polysilicon layer in gate structures 140A and 140B, in accordance with some embodiments. FIG. 6 shows that a portion of the gate electrode layer 116, with the depth of D1, is removed from the gate structures 140A and 140B. During the polysilicon removal process, diluted $NH_4OH$ solution reaches the backside of the substrate, especially the bevel area. As a result, the gate electrode layer 116 on the backside of substrate 120 is also removed, especially at the bevel area. Because the backside bevel area comes in contact with the diluted NH4OH more than the backside center area, polysilicon and the underlying silicon of the bevel area (i.e., edge region) of the backside of substrate 120 is etched more than the center area. Therefore, a portion of silicon of substrate 120 is also etched, as shown in FIG. 6 in accordance with some embodiments. Due to the un-even nature of wet etching near the substrate bevel (i.e., edge regions of the backside of substrate 120), the etched silicon can flake off (i.e., peel off) substrate 120 and create particle problems. Particles, such as particles 129, 130, from bevel of substrate 120 can contaminate the front side of substrate 120 to damage the device structures and degrade yield.

To prevent the silicon in the backside bevel from being etched, the gate electrode layer (a polysilicon layer) 116 on the backside of substrate 120 needs to be protected by a layer that has low etch rate when exposed to diluted $NH_4OH$. In order to have a backside film protecting the gate electrode layer 116, the backside film should be deposited after the deposition of the gate electrode layer 116.

Figure 7:
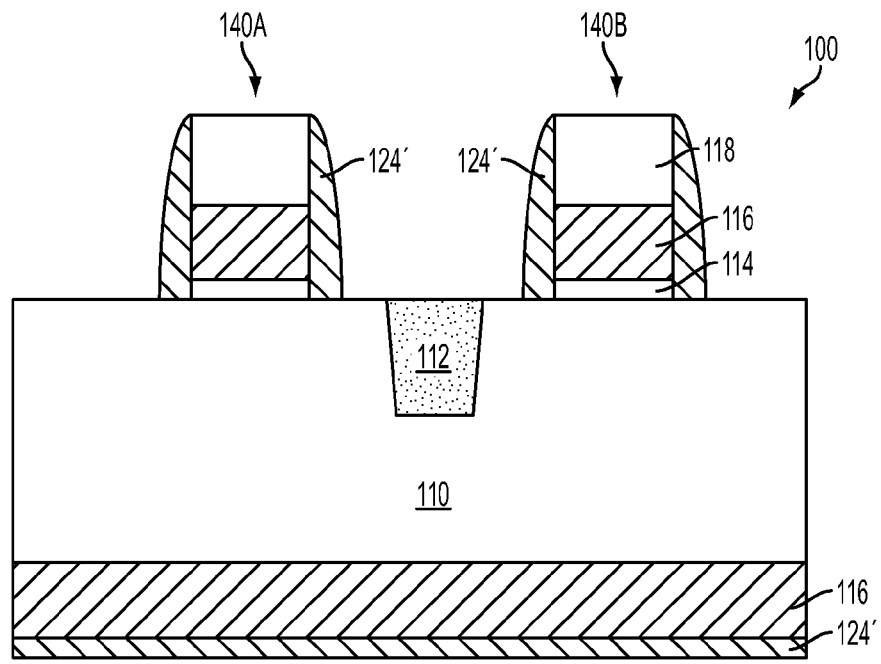
FIG. 7 shows a dielectric layer used to form offset spacers and to also cover a gate electrode layer on the backside of a substrate, in accordance with some embodiments.

As described above in FIGS. 1 and 2, offset spacers 124 are formed after the gate structures are patterned. Offset spacers 124 are formed by blanket depositing a dielectric layer over the gate structures of PMOS/NMOS devices 140A/140B and the substrate 110, and then the dielectric layer is etched to form offset spacers 124. The dielectric layer for the offset spacers 124 comprises, for example, silicon nitride, silicon oxide, silicon carbide, silicon oxynitride, nitride silicon carbide, other suitable materials, and/or combinations thereof. The thickness of the dielectric layer is ranging from 50 Å to about 400 Å. The dielectric layer may be formed by using deposition techniques such as plasma enhanced chemical vapor deposition (PECVD), low-pressure chemical vapor deposition (LPCVD), sub-atmospheric chemical vapor deposition (SACVD), atomic layer deposition (ALD), or plasma-enhanced ALD (PEALD), and the like. If the dielectric layer is deposited by a thermal process in a furnace, the dielectric layer would also coat the backside of substrate 110. In some embodiments, such a thermal process is a LPCVD process. FIG. 7 shows the dielectric layer 124' used to form offset spacers 124 also cover the gate electrode layer 116 on the backside of substrate 110, in accordance with some embodiments. The dielectric layer 124' could protect the gate electrode layer 116 from being etched during the removal of the gate electrode layer 116 in the gate structures 140A and 140B by $NH_4OH$ solution (or by any suitable polysilicon etching solution).

Some dopants for affecting the performance of transistors involving gate structures 140A and 140B are implanted before the formation of the offset spacers 124. For example, the P-type pocket regions 134 could be formed before the formation of the offset spacers 124 to be aligned with the edges of the gate dielectric layer 114, as described above. A thermal process in a furnace could consume high thermal budget and result in un-intended changes in the dopant profiles. Therefore, if the dielectric layer 124' used to form the offset spacers 124 is a thermal process, the temperature and duration of the process should be controlled so as not to significantly alter the dopant profiles. In some embodiments, the thermal process for formation the dielectric layer 124' has a temperature in a range from about 300° C. to about 500° C., because the lowest temperature for dopants to diffuse significantly is about 700° C. for a furnace process. Such a temperature range is very safe for concerns of dopant diffusion. In some embodiments, the duration of the thermal process (i.e., deposition) is in a range from about 30 minutes to about 4 hours. In some embodiments, the dielectric layer 124' is made of SiCN (i.e., nitride silicon carbide). During the formation of the source and drain, SiN is formed as main spacers to define source and drain dopant profiles. The SiN main spacers may be removed subsequently. The dielectric layer 124' is made of a material that has a high etch selectivity (or low etch rate) to SiN etchant. SiCN has a high etch selectivity (or low etch rate) against SiN etchant. However, other types of dielectric materials that have high etch selectivities against SiN etchant may also be used to form dielectric layer 124'.

Figure 8:
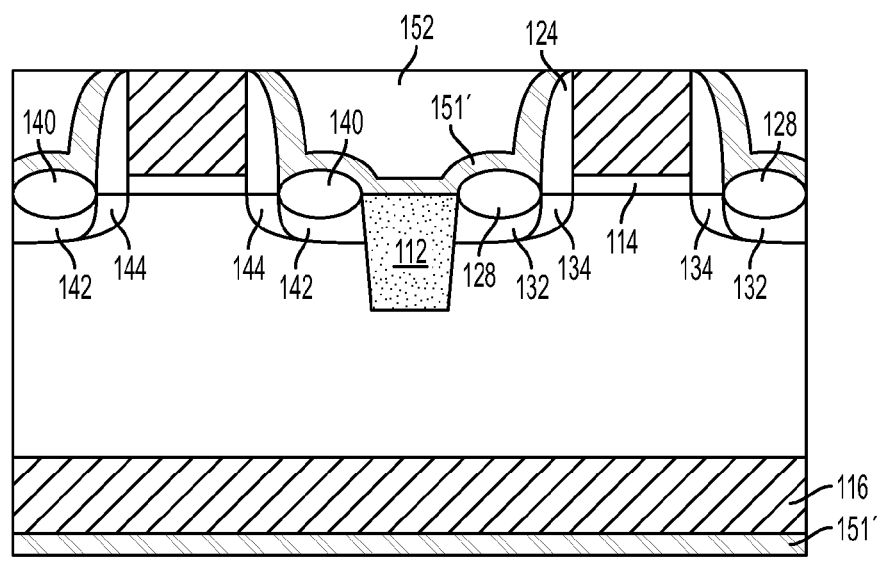
FIG. 8 shows a contact etch stop layer (CESL) deposited on the backside of a substrate, in accordance with some embodiments.

The contact etch stop layer (CESL) 151 is also deposited after the gate electrode layer 116. Therefore, an alternative way to protect the gate electrode layer 116 on the backside of substrate 110 is to deposit the CESL 151 by a thermal process (i.e., a furnace process). As mentioned above, CESL 151 is made of a dielectric material, such as silicon nitride or silicon oxynitride, other suitable materials. It has high etch selectivity in comparison with ILD0 152 and the gate dielectric layer 114 to allow proper contact etching. The thickness of CESL 151 ranges from 100 Å to about 800 Å. As mentioned above, CESL 151 may be formed by using techniques such as plasma enhanced chemical vapor deposition (PECVD), low-pressure chemical vapor deposition (LPCVD), sub-atmospheric chemical vapor deposition (SACVD), atomic layer deposition (ALD), or plasma-enhanced ALD (PEALD), and the like. If CESL 151 is deposited by a thermal process in a furnace, the dielectric layer would also coat the backside of substrate 110. In some embodiments, such a thermal process is a LPCVD process. FIG. 8 shows a CESL 151' deposited on the backside of substrate 110, in accordance with some embodiments. The CESL 151' is deposited by a thermal process and is also deposited on the backside of substrate 110, which could protect the gate electrode layer 116 from being etched during the removal of the gate electrode layer 116 in the gate structures 140A and 140B by $NH_4OH$ solution (or by any suitable polysilicon etching solution).

CESL 151 is deposited and etched after various implants and other processes to form the source and drain (S/D) regions. As a result, thermal budget for depositing CESL 151 by a thermal process (i.e., furnace process) also needs to be taken into consideration to avoid changing dopant profiles. In some embodiments, the thermal process for forming the CESL 151 has a process temperature in a range from about 300° C. to about 500° C. As mentioned above, such a temperature range is very safe for concerns of dopant diffusion. In some embodiments, the duration of the thermal process (i.e., deposition) is in a range from about 30 minutes to about 4 hours. In some embodiments, the CESL is made of SiN or SiON.

Using a thermal process (i.e., furnace process) for deposition of either offset spacers 124 or CESL 151 could provide protection (i.e., coverage) of gate electrode layer 116 and its underlying silicon substrate surface from being etched, especially at the bevel area. Such protection could prevent particle issues resulting from etching of the gate electrode layer 116 and silicon substrate at backside bevel. Alternatively, both offset spacers 124 and CESL 151 can be formed by depositing material layers with thermal processes.

Figure 9:
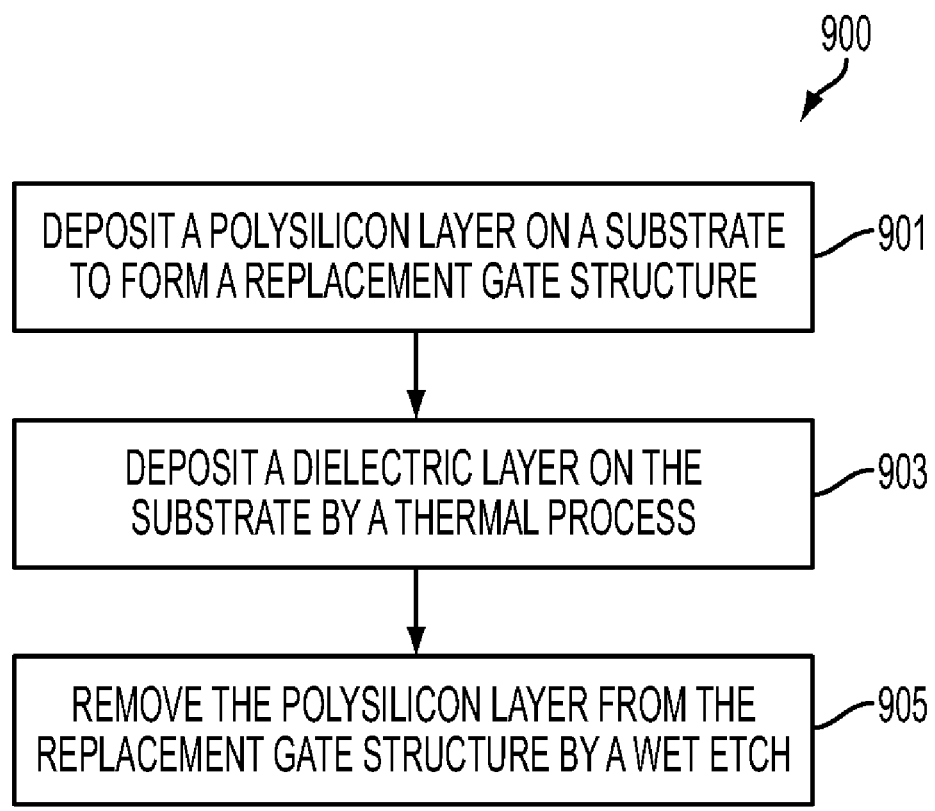
FIG. 9 shows a process flow 900 in accordance with some embodiments.

FIG. 9 shows a process flow 900 of depositing a dielectric layer by a thermal process to protect polysilicon and silicon on the backside of a substrate from etching, in accordance with some embodiments. At operation 901, a polysilicon layer is deposited on a substrate. The polysilicon layer, a dummy gate electrode layer, is deposited to form a replacement gate stack of a gate structure. The polysilicon layer is deposited by a thermal CVD process and the layer covers the backside of the silicon substrate. Other layers and processing are involved in forming the replacement gate, as described above in FIG. 1.

Afterwards, at operation 903, a dielectric layer is deposited on the substrate by a thermal deposition process, such as thermal CVD. The dielectric layer not only covers the front side of the substrate, but also covers the backside of the substrate, including the polysilicon layer at the backside of the substrate, as described above at operation 901. In some embodiments, the dielectric layer is for forming offset spacers and is part of offset spacers. The dielectric layer may be SiCN, SiP, or SiC, in accordance with some embodiments. In some other embodiments, the dielectric layer is for forming CESL and is part of CESL. The CESL dielectric layer may be silicon nitride (SiN) or silicon oxynitride (SiON), in accordance with some embodiments. As described above in FIGS. 1-5, there are many processes involved between the deposition of the polysilicon layer and the thermal dielectric layer. To ensure the deposition of the thermal dielectric layer not impacting dopant diffusion, the thermal budget of the deposition process needs to be kept low. The deposition temperature needs to be kept well below the dopant diffusion temperature. The deposition duration also needs to be controlled.

Afterwards, at operation 905, the polisilicon layer is removed from the replacement gate structure by a wet etch. Due to the protection of the thermal dielectric layer(s) on the backside of the substrate, such as layer 124' of FIG. 7 and/or layer 151' of FIG. 8, the polysilicon layer and silicon on the substrate backside are protected from exposure to the polysilicon wet etch chemistry. Such protection prevents the generation of particles due to etching of polysilicon and the silicon on the substrate backside.

The embodiments described above provide methods and structures for preventing exposing the polysilicon layer and silicon substrate on the substrate backside to polysilicon etching chemistry during removal of the dummy polysilicon layer in replacement gate structures. Thermal deposition process or processes are used to deposit a dielectric layer for offset spacers and/or a contact etch stop layer (CESL) to cover the polysilicon layer on the substrate backside. Such mechanisms reduce or eliminate particles originated at the bevel of the substrate backside due to complete removal of polysilicon layer at the backside bevel and the resultant etching of silicon substrate.

In one embodiment, a method of fabricating an integrated circuit device is provided. The method includes providing a substrate, and forming a replacement gate structure with a dummy polysilicon layer on a first surface of the substrate. The method also includes depositing a dielectric layer by a thermal process to form offset spacers on two opposing sides of the replacement gate structure. The dielectric layer is deposited on the first surface and a second surface opposing the first surface of the substrate. The method further includes removing the dummy polysilicon layer from the replacement gate structure by using a wet etching chemistry. The dielectric layer on the second surface of the substrate protects the second surface of the substrate from being etched by the wet etching chemistry and prevents particles from being generated at the substrate backside bevel.

In another embodiment, a method of fabricating an integrated circuit device is provided. The method includes providing a substrate, and forming a replacement gate structure with a dummy polysilicon layer on a first surface of the substrate. The method also includes depositing a dielectric layer by a thermal process to form a contact etch stop layer (CESL) on the substrate. The dielectric layer is deposited on the first surface and a second surface opposing the first surface of the substrate, and the dielectric layer protects the second surface from being etched by the wet etch chemistry. The method further includes removing the dummy polysilicon layer from the replacement gate structure by using a wet etching chemistry. The dielectric layer on the second surface of the substrate protects the second surface of the substrate from being etched by the wet etching chemistry and prevents particles from being generated at the substrate backside bevel.

In yet another embodiment, a silicon substrate with replacement gate structures is provided. The silicon substrate includes a replacement gate structure on a first surface of the silicon substrate, and a polysilicon layer on a second surface of the substrate. The polysilicon layer is a dummy layer used in forming the replacement gate structure, and the second surface is on an opposite side of the first surface. The polysilicon layer comes in contact with silicon on the second surface of the substrate. The silicon substrate also includes a dielectric layer over the polysilicon layer on the second surface of the substrate. The dielectric layer is deposited by a thermal process, and the dielectric layer protects the polysilicon layer and the silicon on the second surface of the substrate from being exposed to wet etching chemistry used to remove the dummy layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit device, the method comprising:
   providing a substrate;
   forming a replacement gate structure with a dummy polysilicon layer on a first surface of the substrate;
   depositing a dielectric layer by a thermal process to form offset spacers on two opposing sides of the replacement gate structure, wherein the dielectric layer is deposited on the first surface and a second surface opposing the first surface of the substrate; and
   removing the dummy polysilicon layer from the replacement gate structure by using a wet etching chemistry, wherein the dielectric layer on the second surface of the substrate protects the second surface of the substrate from being etched by the wet etching chemistry and prevents particles from being generated at the substrate backside bevel.

2. The method of claim 1, wherein the dielectric layer is made of SiCN.

3. The method of claim 1, wherein the thickness of the dielectric layer is in a range from 50 Å to about 400 Å.

4. The method of claim 1, wherein the dummy polysilicon layer is deposited by thermal chemical vapor deposition (CVD) and covers the second surface of the substrate, and wherein the polysilicon layer on the second surface of the substrate is sandwiched between the dielectric layer and the substrate.

5. The method of claim 1, wherein the thermal process is a low pressure CVD process with a process temperature in a range from about 350° C. to about 500° C.

6. The method of claim 1, wherein the thermal process has a deposition time in a range from about 30 minutes to about 4 hours.

7. The method of claim 1, wherein the wet etching chemistry is a diluted $NH_4OH$.

8. The method of claim 1, further comprising:
   depositing another dielectric layer by another thermal process to form a contact etch stop layer (CESL) on the substrate, wherein the other dielectric layer is also deposited on the second surface of the substrate, and wherein the other dielectric layer also protects the second surface from being etched by the wet etch chemistry.

9. The method of claim 8, wherein the thickness of the CESL is in a range from about 100 Å to about 800 Å.

10. The method of claim 8, wherein the CESL is made of silicon nitride.

11. A method of fabricating an integrated circuit device, the method comprising:
    providing a substrate;
    forming a replacement gate structure with a dummy polysilicon layer on a first surface of the substrate;
    depositing a dielectric layer by a thermal process to form a contact etch stop layer (CESL) on the substrate, wherein the dielectric layer is deposited on the first surface and a second surface opposing the first surface of the substrate, and wherein the dielectric layer protects the second surface from being etched by the wet etch chemistry; and
    removing the dummy polysilicon layer from the replacement gate structure by using a wet etching chemistry, wherein the dielectric layer on the second surface of the substrate protects the second surface of the substrate from being etched by the wet etching chemistry and prevents particles from being generated at the substrate backside bevel.

12. The method of claim 8, wherein the thickness of the CESL is in a range from about 100 Å to about 800 Å.

13. The method of claim 8, wherein the CESL is made of silicon nitride.

14. The method of claim 1, wherein the thermal process is a low pressure CVD process with a process temperature in a range from about 350° C. to about 500° C.

15. The method of claim 1, wherein the thermal process has a deposition time in a range from about 30 minutes to about 4 hours.

16. A method of fabricating an integrated circuit device, the method comprising:
    forming a replacement gate structure with a dummy layer on a first surface of a substrate;
    forming a backside layer having a same material as the replacement gate structure on a second surface opposing the first surface of the substrate;
    depositing a dielectric layer by a thermal process on the first surface and the second surface, wherein the backside layer is between the dielectric layer and the substrate; and
    removing the dummy layer from the replacement gate structure using a wet etching chemistry, wherein the dielectric layer on the second surface of the substrate protects the backside layer and the second surface of the substrate from being etched by the wet etching chemistry.

17. The method of claim 16, wherein forming a replacement gate comprises forming a polysilicon layer.

18. The method of claim 16, wherein depositing the dielectric layer comprises forming offset spaces on two opposing sides of the replacement gate structure using SiCN.

19. The method of claim 16, wherein depositing the dielectric layer comprises forming a contact etch stop layer (CESL) using SiN.

20. The method of claim 16, wherein the thermal process is a low pressure chemical vapor deposition with a process temperature in a range from 350° C. to 500° C.

* * * * *